United States Patent
Lee

(10) Patent No.: US 8,324,553 B2
(45) Date of Patent: Dec. 4, 2012

(54) CHIP-STACKED IMAGE SENSOR HAVING IMAGE SIGNAL SENSING CELL, WHERE THE IMAGE SIGNAL SENSING CELL HAS PHOTODIODES AND CHARGE TRANSMISSION TRANSISTORS COMMONLY CONNECTED TO CHARGE TRANSMISSION PADS

(75) Inventor: Do-Young Lee, Seongnam-si (KR)

(73) Assignee: Siliconfile Technologies Inc., Seoul (KR)

( * ) Notice: Subject to any disclaimer, the term of this patent is extended or adjusted under 35 U.S.C. 154(b) by 527 days.

(21) Appl. No.: 12/529,499

(22) PCT Filed: Mar. 21, 2008

(86) PCT No.: PCT/KR2008/001581
§ 371 (c)(1),
(2), (4) Date: Sep. 1, 2009

(87) PCT Pub. No.: WO2008/117956
PCT Pub. Date: Oct. 2, 2008

(65) Prior Publication Data
US 2010/0019130 A1     Jan. 28, 2010

(30) Foreign Application Priority Data
Mar. 26, 2007   (KR) ................ 10-2007-0029325

(51) Int. Cl.
*H03F 3/08*   (2006.01)
*H01L 27/00*  (2006.01)
*H01J 40/14*  (2006.01)

(52) U.S. Cl. .............. 250/214 R; 250/208.1; 250/239

(58) Field of Classification Search .......... 348/272, 348/274, 275, 281, 294, 302, 303, 304, 308; 257/257, 258, 291, 431, 440, 443, 444, 448, 257/459; 250/208.1, 239, 214.1, 214 R, 250/226
See application file for complete search history.

(56) References Cited

U.S. PATENT DOCUMENTS
6,674,094 B2    1/2004  Sekine
7,045,835 B2 *  5/2006  Layman et al. .............. 257/258
(Continued)

FOREIGN PATENT DOCUMENTS
WO    WO 2006109937    *    3/2006

OTHER PUBLICATIONS
PCT International Search Report of PCT/KR2008/001581 filed on Mar. 21, 2008.

*Primary Examiner* — Que T Le
*Assistant Examiner* — Jennifer Bennett
(74) *Attorney, Agent, or Firm* — Kile Park Goekjian Reed & McManus PLLC

(57) ABSTRACT

A chip-stacked image sensor obtained by embodying an image sensor cell in two chips and combining the chips with each other is provided. The chip-stacked image sensor includes first and second semiconductor chips. The first semiconductor chip includes a plurality of image signal sensing cells for generating image charges corresponding to image signals sensed by at least four photodiodes and outputting the generated image charges through at least two common terminals and a plurality of image charge transmission pads. The second semiconductor chip includes a plurality of image signal conversion cells for converting the image signals into electrical signals and a plurality of image charge receiving pads. Here, the image charges generated by the image signal sensing cells are transmitted to corresponding image signal conversion cells via the plurality of image charge transmission pads and the plurality of image charge receiving pads.

14 Claims, 11 Drawing Sheets

U.S. PATENT DOCUMENTS

| | | | |
|---|---|---|---|
| 7,541,628 B2 * | 6/2009 | Lee et al. | 257/239 |
| 2004/0095495 A1 | 5/2004 | Inokuma et al. | |
| 2006/0197007 A1 | 9/2006 | Iwabuchi et al. | |
| 2008/0083939 A1 * | 4/2008 | Guidash | 257/292 |

* cited by examiner

CHIP-STACKED IMAGE SENSOR HAVING IMAGE SIGNAL SENSING CELL, WHERE THE IMAGE SIGNAL SENSING CELL HAS PHOTODIODES AND CHARGE TRANSMISSION TRANSISTORS COMMONLY CONNECTED TO CHARGE TRANSMISSION PADS

BACKGROUND OF THE INVENTION

1. Field of the Invention

The present invention relates to an image sensor, and more particularly, to a chip-stacked image sensor obtained by embodying an image sensor cell in two chips and combining the chips with each other.

2. Description of the Related Art

FIG. 1 illustrates a 3T-2S image sensor cell obtained by combining two first-type image sensor cells each including three transistors with each other.

Referring to FIG. 1, a 3T-2S image sensor cell 100 is obtained by combining two first-type image sensor cells 110 and 120 each including three transistors with each other. The 3T-2S image sensor cell 100 includes two photodiodes PD0 and PD1, two charge transmission transistors M101 and M102 respectively connected to the photodiodes PD0 and PD1, a common reset transistor M103, and a common conversion transistor M104. The 3T-2S image sensor cell 100 combines two conventional cells with each other and reduces the total number of transistors by two.

Here, since a reset signal Rx01 applied to a gate of the common reset transistor M103 is enabled once when two charge transmission control signals Tx0 and Tx1 respectively applied to gates of the transmission transistors M101 and M102 are enabled, the reset signal Rx01 is represented by using '01 (zero and one)'. A selection signal Sx is enabled once when the two charge transmission control signals Tx0 and Tx1 are enabled.

FIG. 2 illustrates a 3T-2S image sensor cell obtained by combining two second-type image sensor cells each including three transistors with each other.

Referring to FIG. 2, a 3T-2S image sensor cell 200 is obtained by combining two second-type image sensor cells 210 and 220 each including three transistors with each other. The 3T-2S image sensor cell 200 includes two photodiodes PD0 and PD1, two charge transmission transistors M201 and M202 respectively connected to the photodiodes PD0 and PD1, a common reset transistor M203, and a common conversion transistor M204.

In FIG. 1, a terminal of the common reset transistor M103 and a terminal of the common conversion transistor are commonly connected to the selection signal Sx. Unlike FIG. 1, in FIG. 2, a terminal of the common reset transistor M203 is connected to a selection signal Sx, and a terminal of the common conversion transistor M204 is connected to a voltage source Vdd.

FIG. 3 illustrates a 4T-2S image sensor cell obtained by combining two image sensor cells each including four transistors with each other.

Referring to FIG. 3, a 4T-2S image sensor cell 300 is obtained by combining two image sensor cells 310 and 320 each including four transistors with each other. The 4T-2S image sensor cell 300 includes two photodiodes PD0 and PD1, charge transmission transistors M301 and M302 respectively connected to the photodiodes PD0 and PD1, a common reset transistor MC2, a common conversion transistor MC3, and a common selection transistor MC4.

Here, since a reset signal Rx12 applied to a gate of the common reset transistor MC2 is enabled once when two charge transmission control signals Tx1 and Tx2 respectively applied to gates of the transmission transistors M301 and M302 are enabled, the reset signal Rx12 is denoted by using '12'. Similarly, a selection signal Sx12 applied to a gate of the common selection transistor MC4 is denoted by using '12'.

As described above, it is possible to reduce the number of transistors by two by combining two image sensor cells each including three transistors with each other. It is possible to reduce the number of transistors by three by combining two image sensor cells each including four transistors with each other.

In general, as a pixel size of an image sensor decreases, a photodiode area also decreases. Since the photodiode area has a close relation to an amount of available charge, if the photodiode size decreases, the amount of available charge also decreases. The amount of available charge of the photodiode is a characteristic factor for determining a dynamic range of the image sensor. Reduction in the amount of available charge has direct influence on image quality of a sensor.

As shown in FIGS. 1 to 3, although the number of transistors used for the image sensor cell is reduced by using the common reset transistors M103, M203, and MC2, the common conversion transistors M104, M204, and MC3, and the common selection transistor MC4, areas occupied by metal lines through which the transmission signal Tx, the reset signal Rx, and the selection signal Sx are transmitted are large in a layout. The metal lines reduce an area for enabling photodiodes to receive image signals, thereby causing a disadvantage that is reduction of a photodiode size.

SUMMARY OF THE INVENTION

The present invention provides a chip-stacked image sensor capable of utilizing a photodiode area to the maximum extent.

According to an aspect of the present invention, there is provided a chip-stacked image sensor including first and second semiconductor chips.

The first semiconductor chip includes a plurality of image signal sensing cells for generating image charges corresponding to image signals sensed by at least four photodiodes and outputting the generated image charges through at least two common terminals and a plurality of image charge transmission pads. The second semiconductor chip includes a plurality of image signal conversion cells for converting the image signals into electrical signals and a plurality of image charge receiving pads. Here, the image charges generated by the image signal sensing cells are transmitted to corresponding image signal conversion cells via the plurality of image charge transmission pads and the plurality of image charge receiving pads.

DETAILED DESCRIPTION OF PREFERRED EMBODIMENTS

Hereinafter, the present invention will be described in detail by explaining exemplary embodiments of the invention with reference to the attached drawings.

The present invention relates to a chip-stacked image sensor obtained by dividing an image sensor cell into two cells that are an image signal sensing cell including charge transmission transistors and photodiodes, and an image signal conversion cell constructed with two or three transistors, which includes a reset transistor, a conversion transistor, and a selection transistor, embodying the two cells in different chips, and physically combining the chips with each other. Since other components are not disposed in the image signal sensing cell except photodiodes and charge transmission transistors, it is possible to maximize the photodiode area. Accordingly, it is possible to maximize an amount of available charge of the photodiodes.

Here, the image signal sensing cell corresponds to a cell obtained by combining the two photodiodes PD0 and PD1 and charge transmission transistors M101, M102, M201, M202, M301, and M302 with one another. The image signal conversion cell corresponds to a cell obtained by combining the common reset transistors M103, M203, and MC2, the common conversion transistors M104, M204, and MC3, and the common selection transistor MC4 with one another. In the present invention, since four photodiodes are defined as a single processing unit, the image signal sensing cell to be described later includes four photodiodes, and the image signal conversion cell also processes image charges transmitted from four photodiodes.

Figure 1:
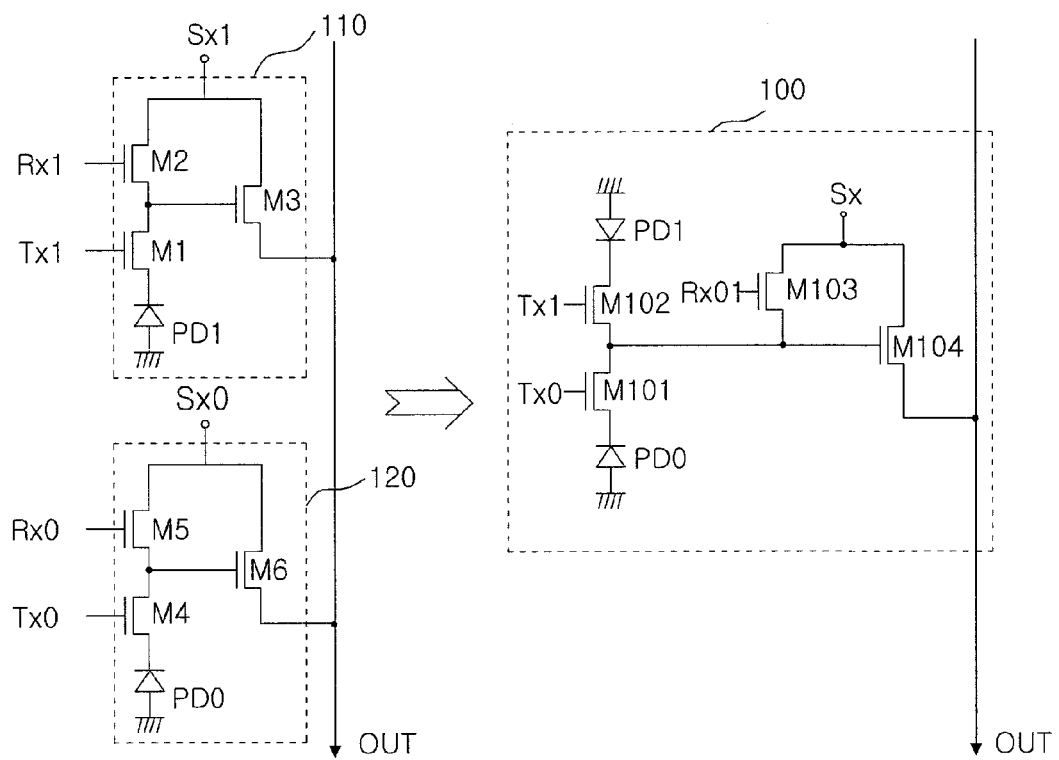
FIG. 1 illustrates a 3T-2S image sensor cell obtained by combining two first-type image sensor cells each including three transistors with each other.
Figure 2:
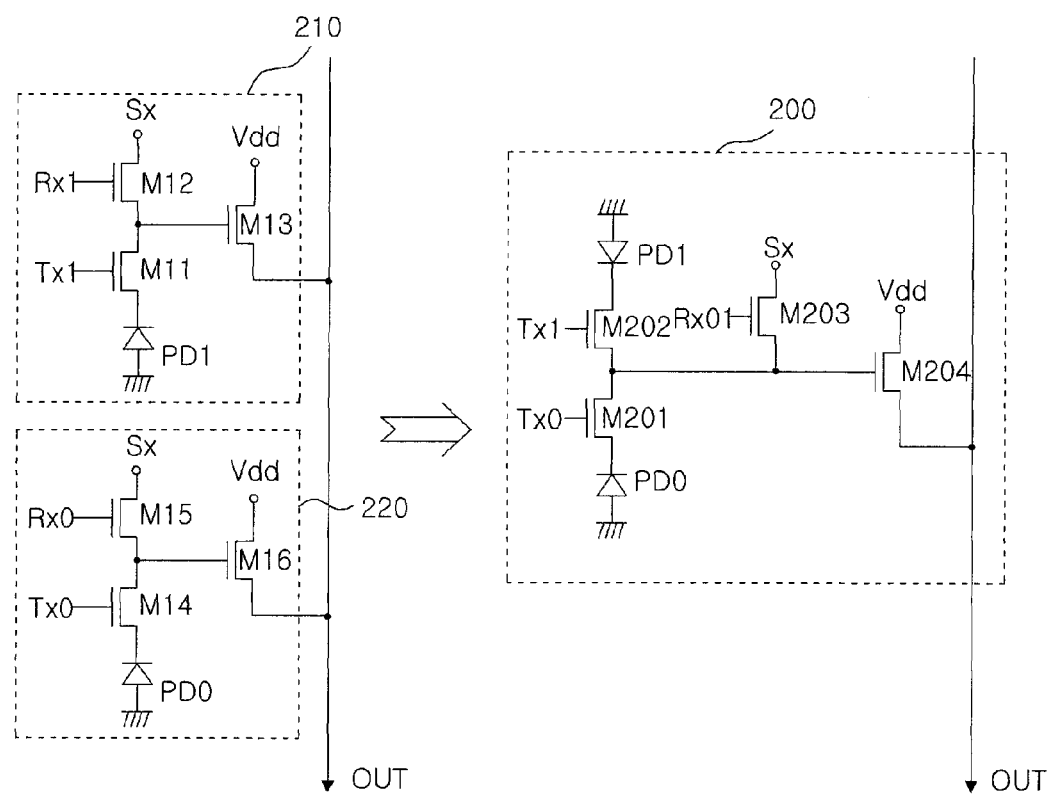
FIG. 2 illustrates a 3T-2S image sensor cell obtained by combining two second-type image sensor cells each including three transistors with each other.
Figure 3:
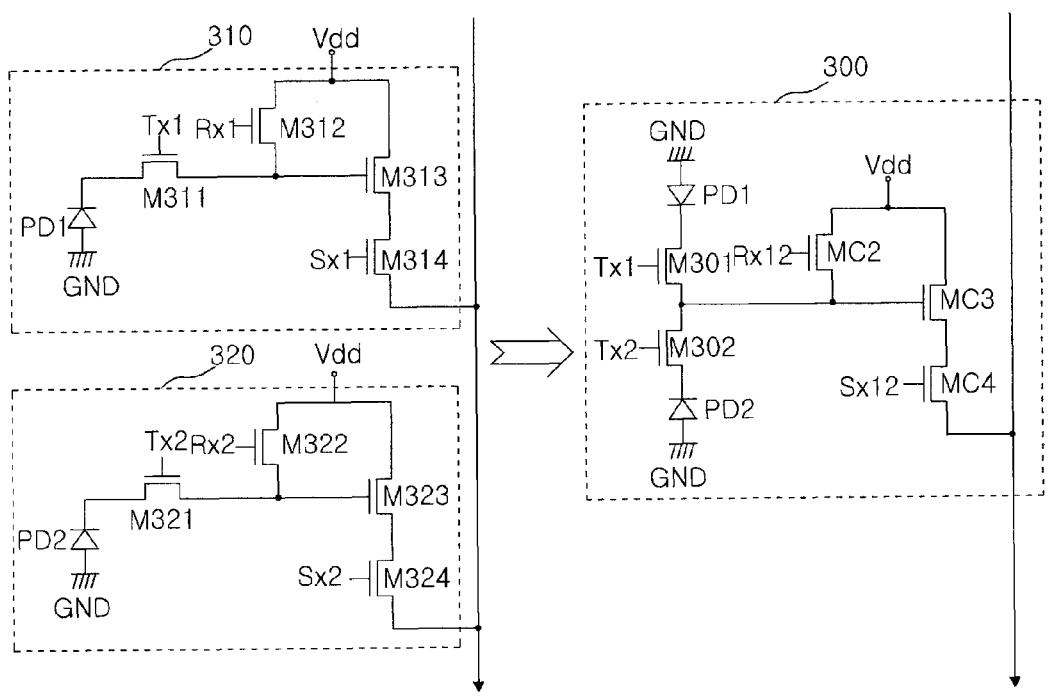
FIG. 3 illustrates a 4T-2S image sensor cell obtained by combining two image sensor cells each including four transistors with each other.
Figure 4:
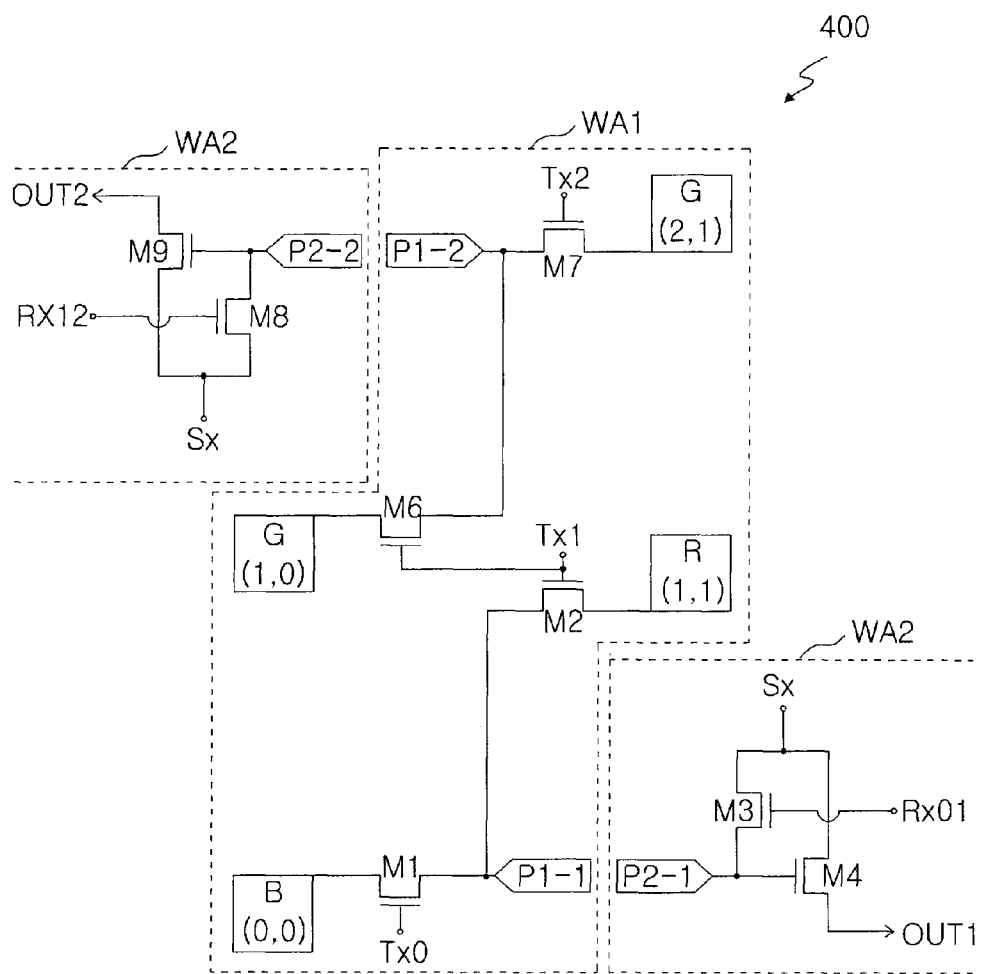
FIG. 4 illustrates a chip-stacked image sensor according to a first embodiment of the present invention.

FIG. 4 illustrates a chip-stacked image sensor according to a first embodiment of the present invention.

Referring to FIG. 4, a chip-stacked image sensor 400 is separately embodied in two semiconductor chips WA1 and WA2. The chip-stacked image sensor 400 includes an image signal sensing cell embodied in a first semiconductor chip WA1 and an image signal conversion cell embodied in a second semiconductor chip WA2. Although for the convenience of description, an image signal sensing cell and an image signal conversion cell are shown in FIG. 4, a plurality of image signal sensing cells shown in FIG. 4 are two-dimensionally arranged in the first semiconductor chip WA1, and a plurality of image signal conversion cells shown in FIG. 4 are two-dimensionally arranged in the second semiconductor chip WA2.

The image signal sensing cell embodied in the first semiconductor chip WA1 includes four photodiodes B(0,0), R(1,1), G(1,0), and G(2,1), four charge transmission transistors M1, M2, M6, and M7, and two image charge transmission pads P1-1 and P1-2.

The four photodiodes are arranged in a manner to be described. A second photodiode (1,1) is disposed in a diagonal direction of a first photodiode (0,0). A third photodiode (1,0) is disposed in a left side of the second photodiode (1,1). A fourth photodiode (2,1) is disposed over the second photodiode (1,1).

Four charge transmission transistors are connected to the four photodiodes. A first charge transmission transistor M1 includes a terminal connected to the first photodiode (0,0) and a gate applied with a first charge transmission signal Tx0. A second charge transmission transistor M2 includes a terminal connected to the second photodiode (1,1) and a gate applied with a second charge transmission signal Tx1. A third charge transmission transistor M6 includes a terminal connected to the third photodiode (1,0) and a gate applied with the second charge transmission signal Tx1. A fourth charge transmission transistor M7 includes a terminal connected to the fourth photodiode (2,1) and a gate applied with the third charge transmission signal Tx2.

Two charge transmission transistors are commonly connected to an image charge transmission pad. A first image charge transmission pad P1-1 is commonly connected to the other terminal of the first charge transmission transistor M1 and the other terminal of the second charge transmission transistor M2. A second image charge transmission pad P1-2 is commonly connected to the other terminal of the third charge transmission transistor M6 and the other terminal of the fourth charge transmission transistor M7.

The image signal conversion cell embodied in the second semiconductor chip WA2 includes two common reset transistors M3 and M8 and two common conversion transistors M4 and M9.

A first common reset transistor M3 includes a terminal connected to a selection signal Sx, the other terminal connected to a first image charge receiving pad P2-1, and a gate applied with a first reset signal Rx01. A first common conversion transistor M4 includes a terminal connected to the selection signal Sx, the other terminal for outputting a first conversion voltage OUT1, and a gate connected to a first image charge receiving pad P2-1. A second common reset transistor M8 includes a terminal connected to the selection signal Sx, the other terminal connected to a second image charge receiving pad P2-2, and a gate applied with a second reset signal Rx12. A second common conversion transistor M9 includes a terminal connected to the selection signal Sx, the other terminal for outputting a second conversion voltage OUT2, and a gate connected to the second image charge receiving pad P2-2.

Hereinafter, operations of the image signal sensing cells and the image signal conversion cells shown in FIG. 4 will be described.

In the image signal sensing cell embodied in the first semiconductor chip WA1, image signals sensed by the four photodiodes are divided and transmitted to the two image charge transmission pads P1-1 and P1-2. Image signals sensed by the first and second photodiodes B(0,0) and R(1,1) are transmitted to the first image charge transmission pad P1-1. Image signals sensed by the third and fourth photodiodes G(1,0) and G(2,1) are transmitted to the second image charge transmission pad P1-2.

When the first charge transmission signal Tx0 is enabled, an image charge generated by the first photodiode B(0,0) is transmitted to the first image charge transmission pad P1-1 via the first charge transmission transistor M1. When the second charge transmission signal Tx1 is enabled, an image charge generated by the second photodiode R(1,1) is transmitted to the first image charge transmission pad P1-1 via the second charge transmission transistor M2. And an image charge generated by the third photodiode G(1,0) is transmitted to the second image charge transmission pad P1-2 via the third charge transmission transistor M6. When the third charge transmission signal Tx2 is enabled, an image charge generated by the fourth photodiode G(2,1) is transmitted to the second image charge transmission pad P1-2 via the fourth charge transmission transistor M7. As is not shown in FIG. 4, an image charge generated by a fifth photodiode B(2,0) is transmitted to a corresponding image charge transmission pad via a corresponding charge transmission transistor.

The first image charge transmission pad P1-1 is electrically connected to the first image charge receiving pad P2-1. The second image charge transmission pad P1-2 is electrically connected to the second image charge receiving pad P2-2.

Image charges transmitted to the first image charge transmission pad P1-1 and the first image charge receiving pad P2-1 are converted into corresponding voltages and output to the first output terminal OUT1 by the first common conversion transistor M4. Image charges transmitted to the second image charge transmission pad P1-2 and the second image charge receiving pad P2-2 are converted into corresponding voltages and output to the second output terminal OUT2 by the second common conversion transistor M9.

Since in the chip-stacked image sensor according to the first embodiment, only photodiodes and charge transmission transistors are embodied in a single chip, an area in which image signals are sensed by the photodiodes becomes large. Thus, an amount of available charge of the photodiodes is maximized. In addition, if image charges generated by four photodiodes are separately output to two image charge transmission pads, there are following advantages.

That is, an image charge corresponding to an image signal incident onto a photodiode via blue and red filters is output to a first image charge transmission pad P1-1. An image charge corresponding to an image signal incident onto a photodiode via a green filter is output to a second image charge transmission pad P1-2. Accordingly, it is possible to rapidly and accurately process the image charges as compared with a conventional signal processing method. That is, in the past, since image charges corresponding to image signals incident via three filters R, G, and B are commonly output to the two output terminals OUT1 and OUT2, a process for distinguishing the image charges from one another has to be performed. However, the chip-stacked image sensor according to the first embodiment needs not perform the process. Accordingly, it is possible to reduce a signal processing time.

In the above description, the image charge corresponding to the image signal incident onto the photodiode via the blue and red filters is output to the first image charge transmission pad P1-1, and the image charge corresponding to the image signal incident onto the photodiode via the green filter is output to the second image charge transmission pad P1-2. However, the image charge corresponding to the image signal incident onto the photodiode via the blue and red filters may be output to the second image charge transmission pad P1-2, and the image charge corresponding to the image signal incident onto the photodiode via the green filter may be output to the first image charge transmission pad P1-1. This relation is determined based on diodes selected from among two-dimensionally arranged photodiodes when four photodiodes are selected as a processing unit.

Figure 5:
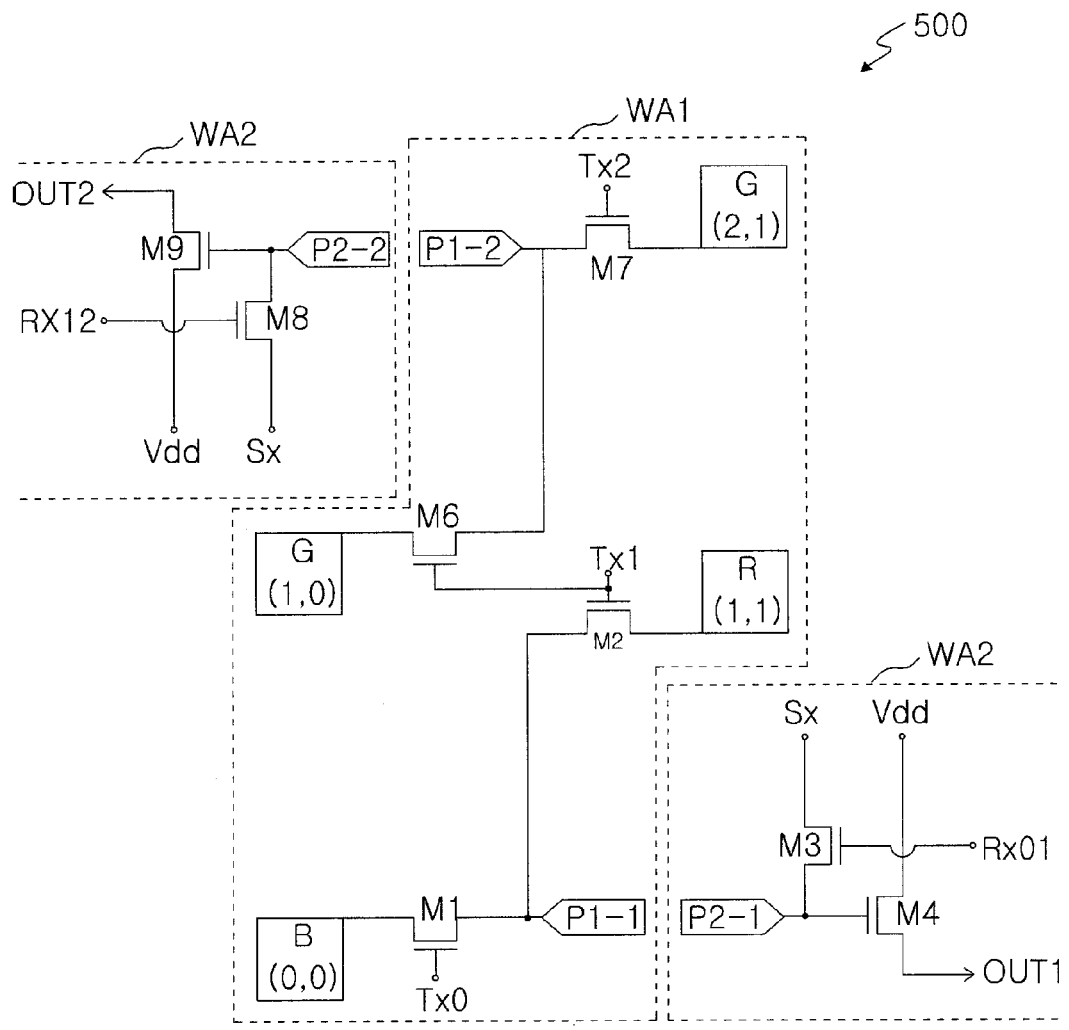
FIG. 5 illustrates a chip-stacked image sensor according to a second embodiment of the present invention.

FIG. 5 illustrates a chip-stacked image sensor according to a second embodiment of the present invention.

Referring to FIGS. 5 and 4, while a terminal of each of two common conversion transistors M4 and M9 is connected to the selection signal Sx in FIG. 4, a corresponding terminal of each of two common conversion transistors M4 and M9 is connected to a voltage source Vdd in FIG. 5. Since a chip-stacked image sensor 500 is almost the same as the chip-stacked image sensor 400 except the aforementioned difference, description on the chip-stacked image sensor according to the second embodiment will be omitted.

Figure 6:
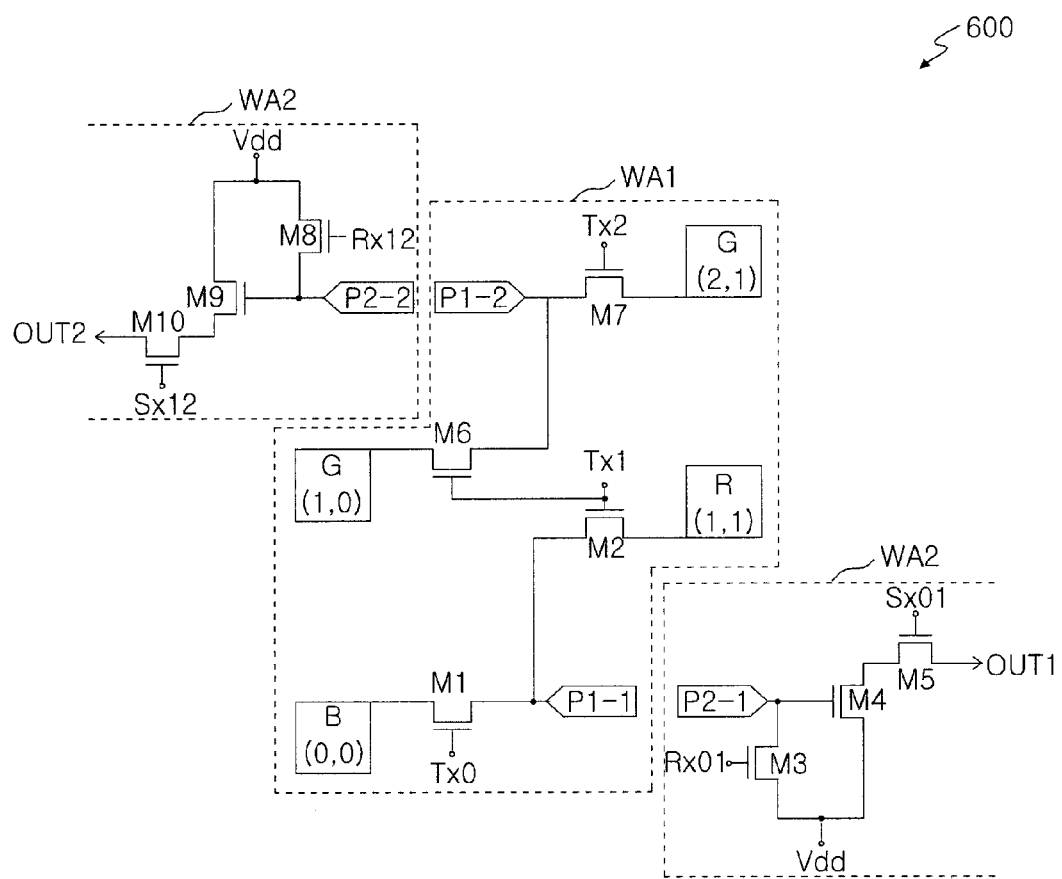
FIG. 6 illustrates a chip-stacked image sensor according to a third embodiment of the present invention.

FIG. 6 illustrates a chip-stacked image sensor according to a third embodiment of the present invention.

Referring to FIG. 6, although four photodiodes of a chip-stacked image sensor 600 are arranged in the same manner as the chip-stacked image sensors 400 and 500 respectively shown in FIGS. 4 and 5, the number of transistors constituting the image charge conversion cell of the chip-stacked image sensor 600 is greater than that of the chip-stacked image sensor 400 or 500 by two (M5 and M10). Accordingly, hereinafter, only the image charge conversion cell embodied in a second semiconductor chip WA2 will be described.

The image charge conversion cell embodied in the second semiconductor chip WA2 includes two common reset transistors M3 and M8, two common conversion transistors M4 and M9, and two selection transistors M5 and M10.

A first common reset transistor M3 includes a terminal connected to a voltage source Vdd, the other terminal connected to a first image charge receiving pad P2-1, and a gate applied with a first reset signal Rx01. A first common conversion transistor M4 includes a terminal connected to the voltage source Vdd and a gate connected to the first image charge receiving pad P2-1. A first common selection transistor M5 includes a terminal connected to the other terminal of the first common conversion transistor M4, the other terminal for outputting a first conversion voltage OUT1, and a gate applied with a first selection signal Sx01.

A second common reset transistor M8 includes a terminal connected to the voltage source Vdd, the other terminal connected to a second image charge receiving pad P2-2, and a gate applied with a second reset signal Rx12. A second common conversion transistor M9 includes a terminal connected to the voltage source Vdd and a gate connected to the second image charge receiving pad P2-2. A second common selection transistor M10 includes a terminal connected to the other terminal of the second common conversion transistor M9, the other terminal for outputting a second conversion voltage OUT2, and a gate applied with a second selection signal Sx12.

Since an operation of the image charge conversion cell is recognized with reference to description on FIG. 4, description on the operation of the image charge conversion cell will be omitted.

It is possible to consider arranged photodiodes to be described later as a basic unit, in addition to the arranged photodiodes shown in FIGS. 4 to 6.

Figure 7:
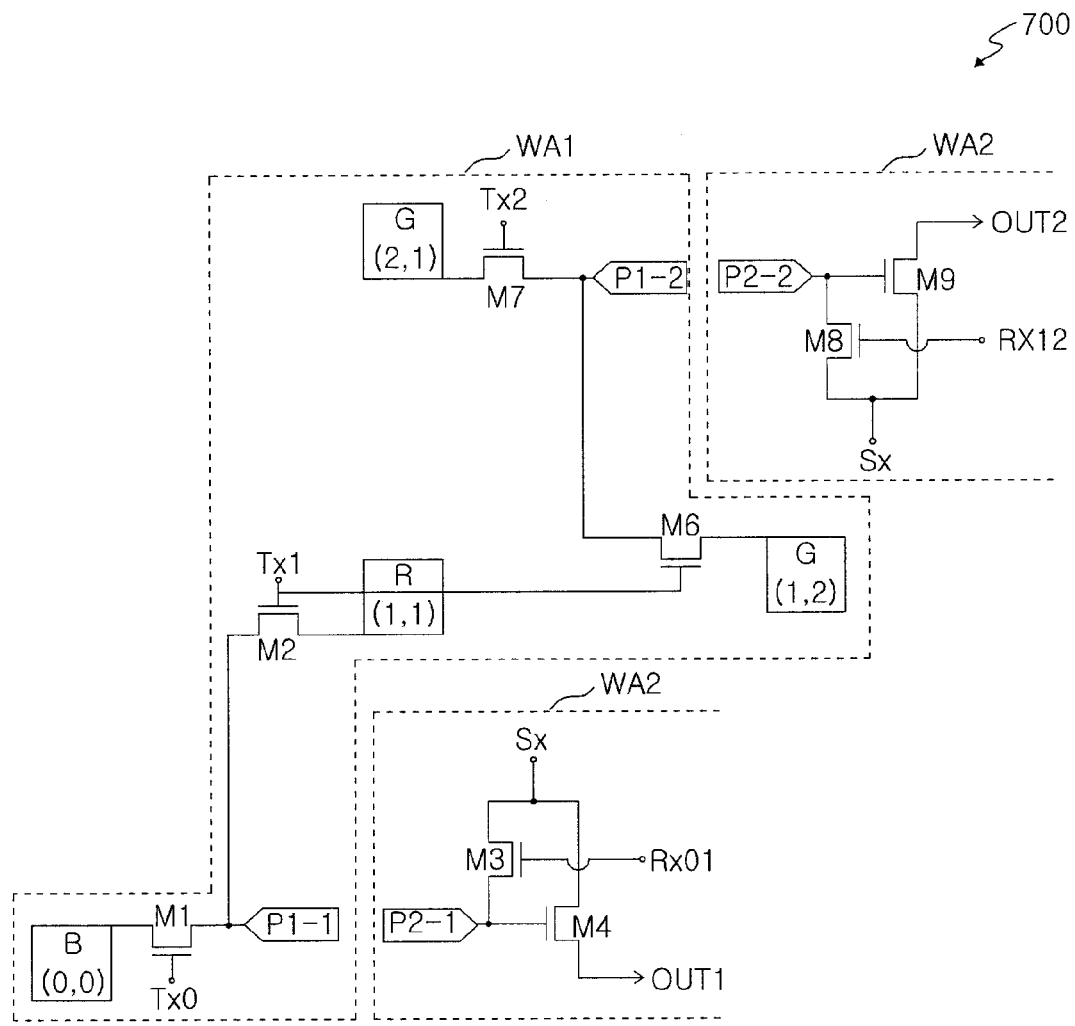
FIG. 7 illustrates a chip-stacked image sensor according to a fourth embodiment of the present invention.

FIG. 7 illustrates a chip-stacked image sensor according to a fourth embodiment of the present invention.

Referring to FIG. 7, a chip-stacked image sensor 700 is the same as the chip-stacked image sensor 400 shown in FIG. 4 in configuration of charge transmission transistors M1, M2, M6, and M7 and image charge conversion cells embodied in a second semiconductor chip WA2 except configuration of the photodiodes embodied in a first semiconductor chip WA1. Accordingly, hereinafter, the configuration of the four photodiodes will be described.

A second photodiode (1,1) is disposed in a diagonal direction of a first photodiode (0,0). A third photodiode (1,2) is disposed in a side of the second photodiode (1,1). A fourth photodiode (2,1) is disposed over the second photodiode (1,1).

A first image charge transmission pad P1-1 outputs image charges generated by the first and second photodiodes (0,0)

and (1,1). A second image charge transmission pad P1-2 outputs image charges generated by the third and fourth photodiodes (1,2) and (2,1).

That is, image charges generated by the first photodiode (0,0) are transmitted to the first image charge transmission pad P1-1 via a first charge transmission transistor M1. Image charges generated by the second photodiode (1,1) are transmitted to the first image charge transmission pad P1-1 via a second charge transmission transistor M2. Image charges generated by the third photodiode (1,2) are transmitted to the second image charge transmission pad P1-2 via a third charge transmission transistor M6. Image charges generated by the fourth photodiode (2,1) are transmitted to the second image charge transmission pad P1-2 via a fourth charge transmission transistor M7.

The first and second photodiodes (0,0) and (1,1) senses image signals incident via the blue and red filters, respectively. The third and fourth photodiodes (1,2) and (2,1) senses image signals incident via the green filters. As described above, since image charges corresponding to the image signals are separately output to different image charge transmission pads, a subsequent procedure of processing the image charges is speedy and simple as compared with a conventional procedure.

Since the rest part is the same as the chip-stacked image sensor 400 shown in FIG. 4, description on the rest part will be omitted.

Figure 8:
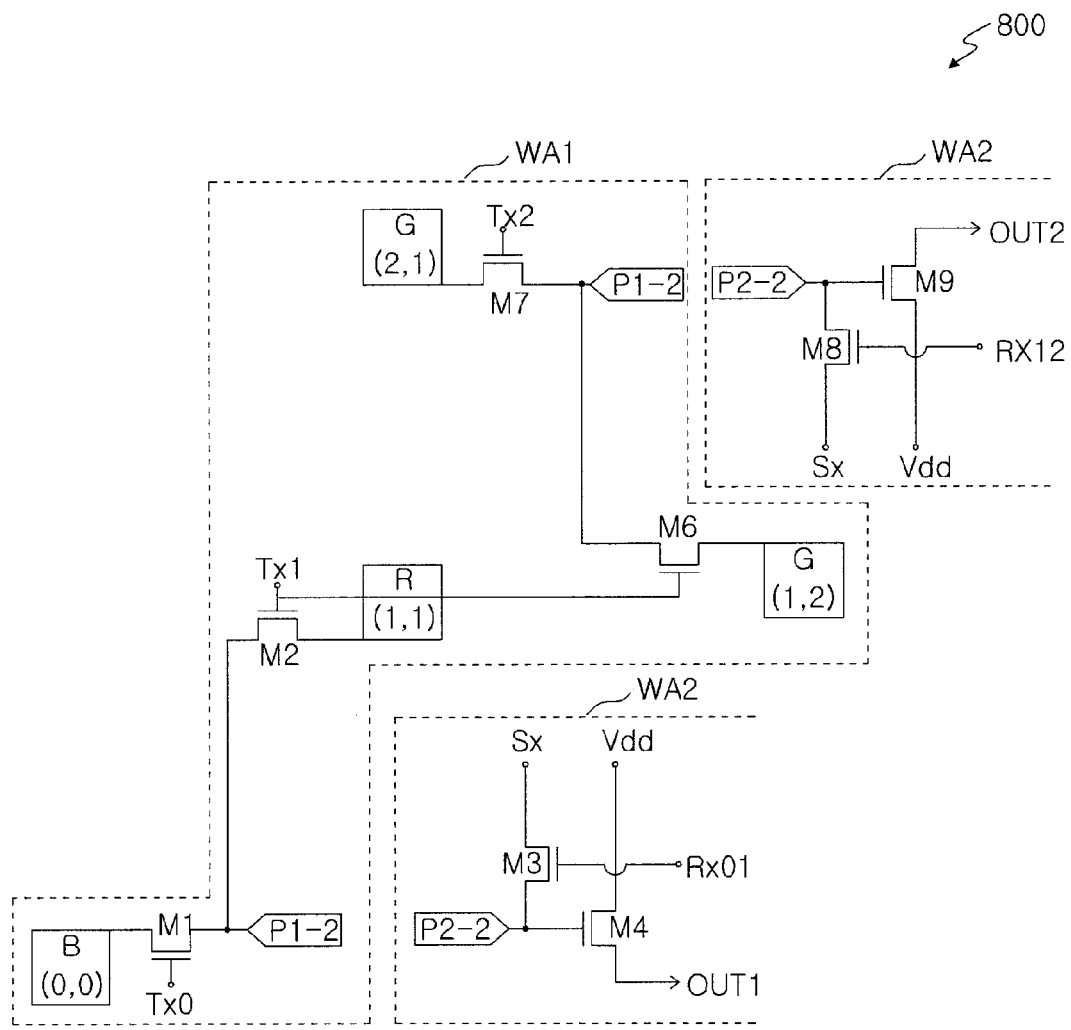
FIG. 8 illustrates a chip-stacked image sensor according to a fifth embodiment of the present invention.

FIG. 8 illustrates a chip-stacked image sensor according to a fifth embodiment of the present invention.

Referring to FIG. 8, a chip-stacked image sensor 800 is the same as the chip-stacked image sensor 700 shown in FIG. 7 in four photodiodes and four charge transmission transistors embodied in a first semiconductor chip WA1. The chip-stacked image sensor 800 is the same as the chip-stacked image sensor 500 shown in FIG. 5 in an image charge conversion cell embodied in a second semiconductor chip WA2. Accordingly, detailed description on the chip-stacked image sensor 800 will be omitted.

Figure 9:
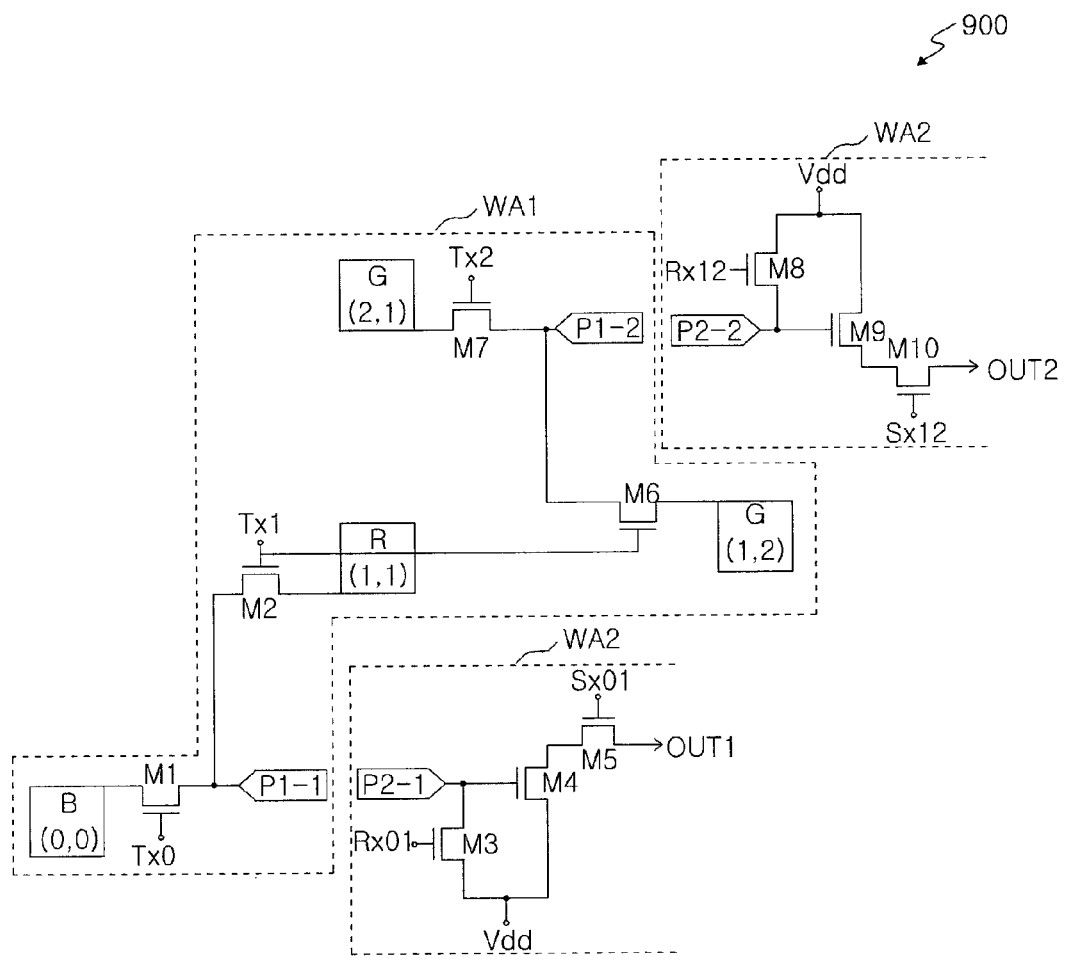
FIG. 9 illustrates a chip-stacked image sensor according to a sixth embodiment of the present invention.

FIG. 9 illustrates a chip-stacked image sensor according to a sixth embodiment of the present invention.

Referring to FIG. 9, a chip-stacked image sensor 900 is the same as the chip-stacked image sensor 700 shown in FIG. 7 in four photodiodes and four charge transmission transistors embodied in a first semiconductor chip WA1. The chip-stacked image sensor 900 is the same as the chip-stacked image sensor 600 shown in FIG. 6 in an image charge conversion cell embodied in a second semiconductor chip WA2. Accordingly, detailed description on the chip-stacked image sensor 900 will be omitted.

Figure 10:
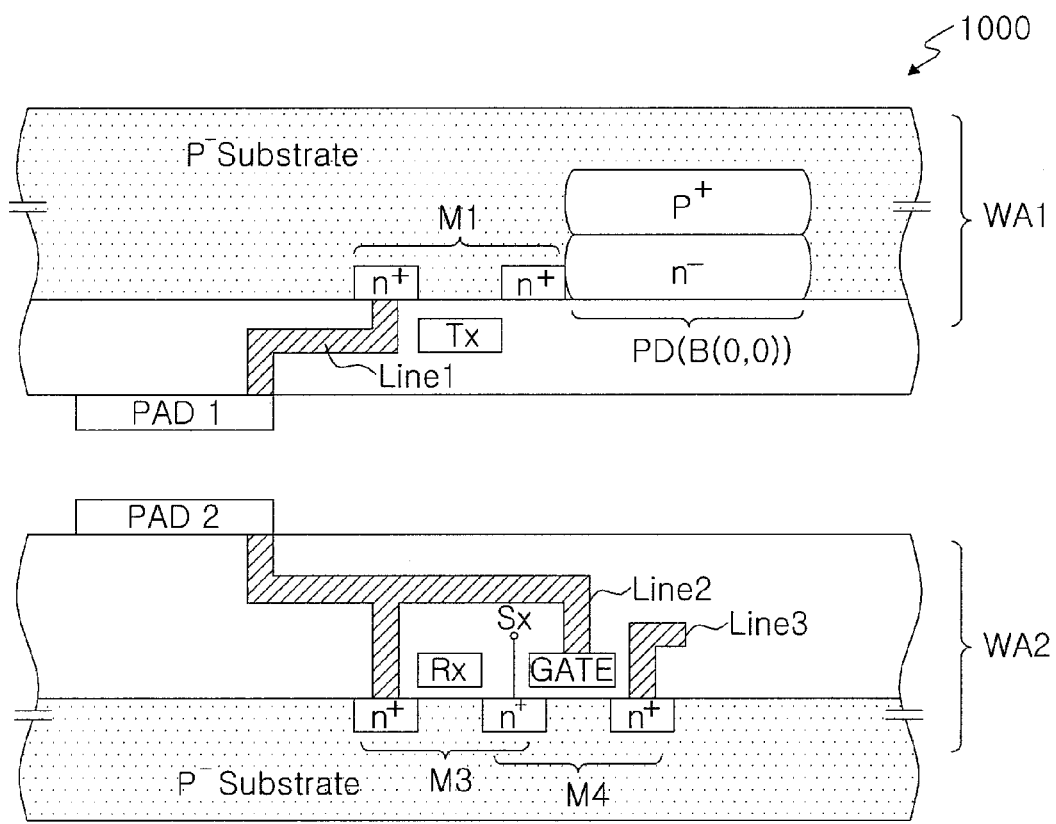
FIG. 10 is a cross-sectional view illustrating a chip-stacked image sensor according to an embodiment of the present invention.

FIG. 10 is a cross-sectional view illustrating a chip-stacked image sensor according to an embodiment of the present invention.

Referring to FIG. 10, a chip-stacked image sensor 1000 includes a first semiconductor chip WA1 in which photodiodes PD(B(0,0) and a first charge transmission transistor M1 are embodied and a second semiconductor chip WA2 in which a common reset transistor M3 and a common conversion transistor M4 are embodied. Image charges are transmitted and received through corresponding pads PAD1 and PAD2 respectively installed in the semiconductor chips WA1 and WA2.

In the first semiconductor chip WA1, the photodiode PD(B (0,0)) and the first charge transmission transistor M1 are embodied on a substrate $P^-$ substrate. A thickness of a wafer is reduced by grinding a lower side of the wafer so as to improve electrical characteristics thereof. Referring to FIG. 10, the ground surface is an upper part of the first semiconductor chip WA1. The photodiodes PD(B(0,0)) generates an image charge corresponding to an image signal incident onto the ground part of the first semiconductor chip WA1. The generated image charge is transmitted to an image charge transmission pad PAD1 through a first metal line Line1 formed on the substrate via the first charge transmission transistor M1. At this time, it is determined whether the image charge generated by the photodiode PD(B(0,0)) is transmitted based on a first charge transmission signal Tx applied to a gate of the first charge transmission transistor M1.

In the second semiconductor chip WA2, the common reset transistor M3 and the common conversion transistor M4 are embodied on a substrate. Like the first semiconductor chip WA1, a lower side of a substrate is ground after processes of the second semiconductor chip WA2 are completed. Referring to FIG. 10, the ground surface is a lower part of the second semiconductor chip WA2. An image charge received by the common conversion transistor M4 through the image charge transmission pad PAD1, the image charge receiving pad PAD2, and a second metal line Line2 is converted into a corresponding voltage and output through a third metal line Line3.

Here, the second and third metal lines Line2 and Line3 are used to distinguish two metal lines from each other. This does not indicate that the second and third metal lines are located in different layers. According to procedures of the semiconductors for embodying the image sensor, the second and third metal lines Line2 and Line3 may be embodied in the same layer or different layers.

Referring to FIG. 10, the chip-stacked image sensor according to the embodiment of the present invention is obtained by reversing the first semiconductor chip WA1 and stacking the reversed first semiconductor chip WA1 and the second semiconductor chip WA2 so that corresponding pads PAD1 and PAD2 are electrically connected.

Figure 11:
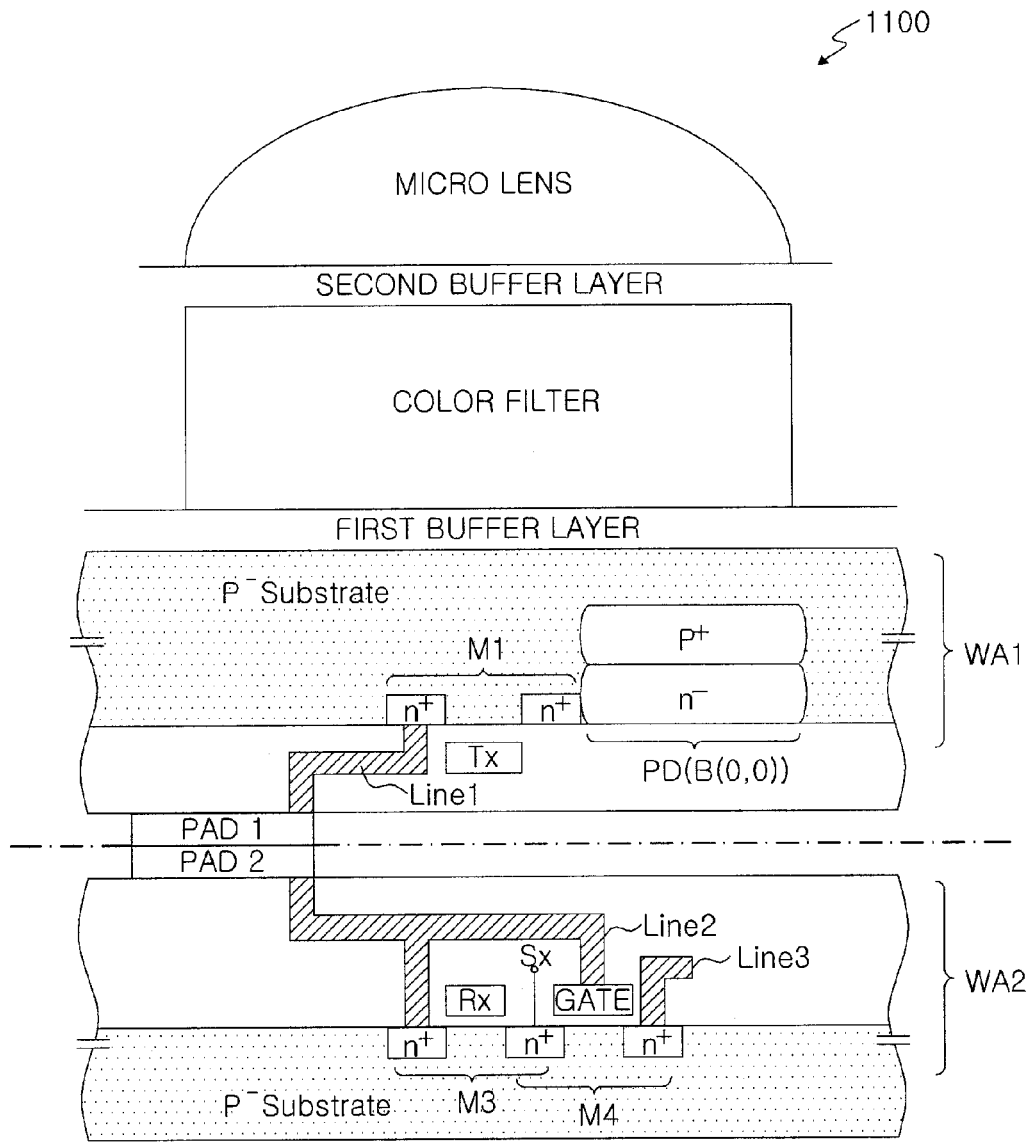
FIG. 11 is a cross-sectional view illustrating an image sensing device using a chip-stacked image sensor according to an embodiment of the present invention.

FIG. 11 is a cross-sectional view illustrating an image sensing device using a chip-stacked image sensor according to an embodiment of the present invention.

Referring to FIG. 11, an image sensing device 1100 is embodied by sequentially stacking a first buffer layer, a color filter, a second buffer layer, and a micro lens on the chip-stacked image sensor WA1+WA2. Since an operation of the image sensing device 1100 shown in FIG. 11 is generally known, the description on the operation of the image sensing device 1100 will be omitted. However, it is easily understood with reference to FIG. 11 that it is possible to directly apply the chip-stacked image sensor according to the embodiment to a conventional device.

As described above, in the chip-stacked image sensor according to an embodiment of the present invention, it is possible to maximize an amount of available charge of photodiodes since it is possible to maximize a photodiode area for receiving image signals incident onto the image sensor by embodying only the photodiodes and charge transmission transistors for transmitting image charges generated by the photodiodes in a semiconductor chip and by converting the image charges by using another semiconductor chip corresponding to the semiconductor chip.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A chip-stacked image sensor comprising:

a first semiconductor chip comprising a plurality of image signal sensing cells for generating image charges corresponding to image signals, wherein each of the image signal sensing cells comprises at least four photodiodes and at least two image charge transmission pads; and a second semiconductor chip comprising a plurality of image signal conversion cells for converting the image signals into electrical signals, wherein each of the image signal conversion cells comprises at least two image charge receiving pads, wherein the image charges generated by a first image signal sensing cell in the plurality of image signal sensing cells are transmitted to a first image signal conversion cell in the plurality of image signal conversion cells via the at least two image charge transmission pads of the first image signal sensing cell and the at least two image charge receiving pads of the first image signal conversion cell, and wherein the first image signal sensing cell comprises:
a first photodiode (0,0);
a second photodiode (1,1) disposed in a diagonal direction of the first photodiode (0,0);
a third photodiode (1,0) disposed in a side of the second photodiode (1,1) and over the first photodiode (0, 0);
a fourth photodiode (2,1) disposed over the second photodiode (1, 1);
a first charge transmission transistor M1 comprising a terminal connected to the first photodiode (0,0) and a gate applied with a first charge transmission signal Tx0;
a second charge transmission transistor M2 comprising a terminal connected to the second photodiode (1,1 and a gate applied with a second charge transmission signal Tx1;
a third charge transmission transistor M6 comprising a terminal connected to the third photodiode (1,0) and a gate applied with the second charge transmission signal Tx1;
a fourth charge transmission transistor M7 comprising a terminal connected to the fourth photodiode (2,1) and a gate applied with a third charge transmission signal Tx2;
a first image charge transmission pad P1-1 commonly connected to the other terminal of the first charge transmission transistor M1 and the other terminal of the second charge transmission transistor M2; and
a second image charge transmission pad P1-2 commonly connected to the other terminal of the third charge transmission transistor M6 and the other terminal of the fourth charge transmission transistor M7.

2. The chip-stacked image sensor of claim 1,
wherein the image charge transmission pads of the first semiconductor chip and the image charge receiving pads of the second semiconductor chip are arranged in one-to-one correspondence, and
wherein the first and second semiconductor chips are combined with each other.

3. The chip-stacked image sensor of claim 1, wherein the first image signal conversion cell comprises:
a first image charge receiving pad P2-1;
a second image charge receiving pad P2-2;
a first common reset transistor M3 comprising a terminal connected to a selection signal Sx, the other terminal connected to the first image charge receiving pad P2-1, and a gate applied with a first reset signal Rx01;
a first common conversion transistor M4 comprising a terminal connected to the selection signal Sx, the other terminal for outputting a first conversion voltage OUT1, and a gate connected to the first image charge receiving pad P2-1;
a second common reset transistor M8 comprising a terminal connected to the selection signal Sx, the other terminal connected to the second image charge receiving pad P2-2, and a gate applied with a second reset signal Rx12; and
a second common conversion transistor M9 comprising a terminal connected to the selection signal Sx, the other terminal for outputting a second conversion voltage OUT2, and a gate connected to the second image charge receiving pad P2-2.

4. The chip-stacked image sensor of claim 3, wherein when the first and second semiconductor chips are combined with each other, a position of the first image charge transmission pad P1-1 is matched with a position of the first image charge receiving pad P2-1, and a position of the second image charge transmission pad P1-2 is matched with a position of the second image charge receiving pad P2-2.

5. The chip-stacked image sensor of claim 1, wherein the first image signal conversion cell comprises:
a first image charge receiving pad P2-1;
a second image charge receiving pad P2-2;
a first common reset transistor M3 comprising a terminal connected to a selection signal Sx, the other terminal connected to the first image charge receiving pad P2-1, and a gate applied with a first reset signal Rx01;
a first common conversion transistor M4 comprising a terminal connected to a voltage source Vdd, the other terminal for outputting a first conversion voltage OUT1, and a gate connected to the first image charge receiving pad P2-1;
a second common conversion transistor M9 comprising a terminal connected to the voltage source Vdd, the other terminal for outputting a second conversion voltage OUT2, and a gate connected to the second image charge receiving pad P2-2; and
a second common reset transistor M8 comprising a terminal connected to the selection signal Sx, the other terminal connected to the second image charge receiving pad P2-2, and a gate applied with a second reset signal Rx12.

6. The chip-stacked image sensor of claim 1, wherein the first image signal conversion cell comprises:
a first image charge receiving pad P2-1;
a second image charge receiving pad P2-2;
a first common reset transistor M3 comprising a terminal connected to a voltage source Vdd, the other terminal connected to the first image charge receiving pad P2-1, and a gate applied with a first reset signal Rx01;
a first common conversion transistor M4 comprising a terminal connected to the voltage source Vdd and a gate connected to the first image charge receiving pad P2-1;
a first common selection transistor M5 comprising a terminal connected to the other terminal of the first common conversion transistor M4, the other terminal for outputting a first conversion voltage, and a gate applied with a first selection signal Sx01;
a second common reset transistor M8 comprising a terminal connected to the voltage source Vdd, the other terminal connected to the second image charge receiving pad P2-2, and a gate applied with a second reset signal Rx12;

a second common conversion transistor M9 comprising a terminal connected to the voltage source Vdd and a gate connected to the second image charge receiving pad P2-2; and a second common selection transistor M10 comprising a terminal connected to the other terminal of the second common conversion transistor M9, the other terminal for outputting a second conversion voltage, and a gate applied with a second selection signal Sx12.

7. The chip-stacked image sensor of claim 1,
wherein when the third and fourth photodiodes (1,0) and (2,1) operate in response to the image signals incident via a first filter, the first and second photodiodes (0,0) and (1,1) operate in response to the image signals respectively incident via second and third filters.

8. The chip-stacked image sensor of claim 7, wherein the first filter is a green filter, and each the second and third filters is a red or blue filter.

9. A chip-stacked image sensor comprising:

a first semiconductor chip comprising a plurality of image signal sensing cells for generating image charges corresponding to image signals, wherein each of the image signal sensing cells comprises at least four photodiodes and at least two image charge transmission pads; and a second semiconductor chip comprising a plurality of image signal conversion cells for converting the image signals into electrical signals, wherein each of the image signal conversion cells comprises at least two image charge receiving pads, wherein the image charges generated by a first image signal sensing cell in the plurality of image signal sensing cells are transmitted to a first image signal conversion cell in the plurality of image signal conversion cells via the at least two image charge transmission pads of the first image signal sensing cell and the at least two image charge receiving pads of the first image signal conversion cell, and wherein the first image signal sensing cell comprises:
a first photodiode (0,0);
a second photodiode (1,1) disposed in a diagonal direction of the first photodiode (0, 0);
a third photodiode (1,2) disposed in a side of the second photodiode (1, 1);
a fourth photodiode (2,1) disposed over the second photodiode (1, 1);
a first charge transmission transistor M1 comprising a terminal connected to the first photodiode (0,0) and a gate applied with a first charge transmission signal Tx0;
a second charge transmission transistor M2 comprising a terminal connected to the second photodiode (1,1) and a gate applied with a second charge transmission signal Tx1;
a third charge transmission transistor M6 comprising a terminal connected to the third photodiode (1,2) and a gate applied with the second charge transmission signal Tx1;
a fourth charge transmission transistor M7 comprising a terminal connected to the fourth photodiode (2,1) and a gate applied with a third charge transmission signal Tx2;
a first image charge transmission pad P1-1 commonly connected to the other terminal of the first charge transmission transistor M1 and the other terminal of the second charge transmission transistor M2; and
a second image charge transmission pad P1-2 commonly connected to the other terminal of the third charge transmission transistor M6 and the other terminal of the fourth charge transmission transistor M7.

10. The chip-stacked image sensor of claim 9, wherein the first image signal conversion cell comprises:
a first image charge receiving pad P2-1;
a second image charge receiving pad P2-2;
a first common reset transistor M3 comprising a terminal connected to a selection signal Sx, the other terminal connected to the first image charge receiving pad P2-1, and a gate applied with a first reset signal Rx01;
a first common conversion transistor M4 comprising a terminal connected to the selection signal Sx, the other terminal for outputting a first conversion voltage, and a gate connected to the first image charge receiving pad P2-1;
a second common reset transistor M8 comprising a terminal connected to the selection signal Sx, the other terminal connected to the second image charge receiving pad P2-2, and a gate applied with a second reset signal Rx12; and
a second common conversion transistor M9 comprising a terminal connected to the selection signal Sx, the other terminal for outputting a second conversion voltage, and a gate connected to the second image charge receiving pad P2-2.

11. The chip-stacked image sensor of claim 9, wherein the first image signal conversion cell comprises:
a first image charge receiving pad P2-1;
a second image charge receiving pad P2-2;
a first common reset transistor M3 comprising a terminal connected to a selection signal Sx, the other terminal connected to the first image charge receiving pad P2-1, and a gate applied with a first reset signal Rx01;
a first common conversion transistor M4 comprising a terminal connected to a voltage source Vdd, the other terminal for outputting a first conversion voltage OUT1, and a gate connected to the first image charge receiving pad P2-1;
a second common conversion transistor includes M9 comprising a terminal connected to the voltage source Vdd, the other terminal for outputting a second conversion voltage OUT2, and a gate connected to the second image charge receiving pad P2-2; and
a second common reset transistor M8 comprising a terminal connected to the selection signal Sx, the other terminal connected to the second image charge receiving pad P2-2, and a gate applied with a second reset signal Rx12.

12. The chip-stacked image sensor of claim 9, wherein the first image signal conversion cell comprises:
a first image charge receiving pad P2-1;
a second image charge receiving pad P2-2;
a first common reset transistor M3 comprising a terminal connected to a voltage source Vdd, the other terminal connected to the first image charge receiving pad P2-1, and a gate applied with a first reset signal Rx01;
a first common conversion transistor M4 comprising a terminal connected to the voltage source Vdd and a gate connected to the first image charge receiving pad P2-1;
a first common selection transistor M5 comprising a terminal connected to the other terminal of the first common conversion transistor M4, the other terminal for outputting a first conversion voltage OUT1, and a gate applied with a first selection signal Sx01;
a second common reset transistor M8 comprising a terminal connected to the voltage source Vdd, the other terminal connected to the second image charge receiving pad P2-2, and a gate applied with a second reset signal Rx12;

a second common conversion transistor M9 comprising a terminal connected to the voltage source Vdd and a gate connected to the second image charge receiving pad P2-2; and a second common selection transistor M10 including comprising a terminal connected to the other terminal of the second common conversion transistor M9, the other terminal for outputting a second conversion voltage, and a gate applied with a second selection signal Sx12.

13. The chip-stacked image sensor of claim 9 wherein when the third and fourth photodiodes (1,2) and (2,1) operate in response to the image signals incident via a first filter, the first and second photodiodes (0,0) and (1,1) operate in response to the image signals respectively incident via second and third filters.

14. The chip-stacked image sensor of claim 13, wherein the first filter is a green filter, and each the second and third filters is a red or blue filter.

* * * * *